(12) United States Patent
Alexander

(10) Patent No.: US 6,765,419 B2
(45) Date of Patent: Jul. 20, 2004

(54) DYNAMIC DELAY LINE CONTROL

(75) Inventor: George W. Alexander, Durham, NC (US)

(73) Assignee: Infineon Technologies AG, Munich (DE)

( * ) Notice: Subject to any disclaimer, the term of this patent is extended or adjusted under 35 U.S.C. 154(b) by 79 days.

(21) Appl. No.: 10/094,793

(22) Filed: Mar. 11, 2002

(65) Prior Publication Data

US 2003/0169083 A1 Sep. 11, 2003

(51) Int. Cl.[7] .................................................. H03L 7/06
(52) U.S. Cl. ...................................... 327/158; 327/149
(58) Field of Search ................................. 327/269–271, 327/276–277, 284, 149, 152, 153, 161, 158

(56) References Cited

U.S. PATENT DOCUMENTS 6,163,759 A 12/2000 Kita
6,222,894 B1 4/2001 Lee
6,445,231 B1 * 9/2002 Baker et al. ................. 327/158
6,448,756 B1 * 9/2002 Loughmiller ............. 324/76.54

FOREIGN PATENT DOCUMENTS

DE         19934226 A1    7/2000
JP         2000138569     5/2000

* cited by examiner

Primary Examiner—Timothy P. Callahan
Assistant Examiner—Cassandra Cox
(74) Attorney, Agent, or Firm—Thomas R. FitzGerald, Esq.

(57) ABSTRACT

A delay lock loop circuit for aligning in time a reference clock signal with an internal feedback clock signal includes a forward delay circuit that receives the reference clock signal. The forward delay circuit includes a forward delay line having a plurality of electrically interconnected delay blocks. Each of the delay blocks includes a predetermined number of electrically interconnected delay units. Disabling means deactivate the one or more delay blocks when the delay blocks are not needed in order to time align the reference clock signal and the internal feedback clock signal.

18 Claims, 4 Drawing Sheets

DYNAMIC DELAY LINE CONTROL

FIELD OF THE INVENTION

The present invention relates generally to integrated circuits, and, more particularly, to a delay lock loop circuit.

BACKGROUND OF THE INVENTION

Clock signals are used in virtually every integrated circuit (IC) to control the operational timing of the IC and/or the transfer of data within and between ICs. For example, all individual circuits or devices, such as, for example, flip-flops and/or latches, in a given IC may change state on a single rising or falling edge of a common clock signal. Relatively large ICs, such as, for example, memory chips and programmable logic arrays, include thousands or even millions of such individual circuits or devices. The clock signal is typically applied to a clock input pin of the IC for distribution to each of those numerous devices throughout the IC. Thus, the clock signal is transmitted or propagated from the clock input pin to devices on the IC that are both relatively near to and relatively distant from the clock input pin. By the time the clock signal reaches the devices that are disposed on portions of the IC that are relatively remote from the input pin, the clock signal is likely to have suffered significant propagation delay.

The clock signal received at the IC clock input is hereinafter referred to as the input or reference clock signal REF_CLK, whereas the clock signal received by the last-served device on the IC is hereinafter referred to as the propagated clock signal P_CLK. The propagation delay between the REF_CLK and P_CLK signals, designated hereinafter as $t_P$, may cause difficulties in interfacing between ICs and/or slow down the overall operating speed of a system. For example, data may be provided or input to an IC in a time-aligned manner relative to the reference clock signal, whereas data output from the IC is likely to be provided in a time-aligned manner with the propagated clock signal.

The propagation delay $t_P$ for a particular IC is dependent at least in part upon the configuration of that particular IC. Thus, for a given IC $t_P$ operating at standard or rated operating conditions, temperatures and voltages, $t_P$ will generally not vary substantially. However, $t_P$ will vary due to external factors, such as, for example, changes in ambient temperature and/or applied voltage. It is beneficial to compensate for the effect of such external factors on the propagation delay $t_P$ of the reference clock signal by time-aligning the propagated clock signal P_CLK of an IC with the reference clock signal REF_CLK. Delay lock loop circuits are one way in which such time alignment of signals is performed.

Delay lock loop (DLL) circuits receive the reference clock signal REF_CLK and produce an output clock signal CLK_OUT that is advanced or delayed relative to the reference clock signal REF_CLK. For convenience, all signals produced by a DLL will hereinafter be referred to as being delayed relative to the REF_CLK signal regardless of whether the particular signal is actually advanced or delayed relative to the reference clock signal. A DLL delays the output clock signal CLK_OUT by an amount of time that is approximately equal to the propagation delay $t_P$ of the IC, i.e., the amount of time required for the reference clock signal REF_CLK to propagate through the IC under standard or normal operating conditions. Further, a DLL adjusts the CLK_OUT signal to compensate for changes in $t_P$ due to the aforementioned external factors. Devices formed on portions of the IC that are proximate the clock input pin are typically supplied with the REF_CLK signal, whereas devices formed on portions of the IC relatively distant from the input clock signal are typically supplied with the CLK_OUT signal via on off chip driver. Thus, all devices on the IC receive clock signals that are aligned in time.

The DLL adjusts the amount of time by which the CLK_OUT signal is delayed relative to the REF_CLK signal by comparing the REF_CLK signal to a feedback clock signal FB_CLK that models the propagation delay of the IC. The CLK_OUT signal is essentially a delayed version of the REF_CLK signal. The delay of the CLK_OUT signal is adjusted by a forward delay circuit having a forward delay line. The forward delay line includes a plurality of individual delay units, such as, for example, a predetermined number of buffers or invertors connected together in series. The length of the forward delay line is adjusted based upon a comparison of the REF_CLK signal to the feedback clock signal FB_CLK, to thereby adjust the delay of the CLK_OUT signal relative to the REF_CLK signal.

Generally, a DLL must provide a minimum delay time approximately equal to the longest anticipated cycle time (i.e., the lowest operating frequency) of the REF_CLK signal to ensure alignment of the REF_CLK signal with the FB_CLK signal under worst-case operating conditions. In relatively high-frequency applications, such as, for example, in dynamic random access memory (DRAM) chips or other ICs that require clock skew adjustment, the entire length of the delay line is rarely required. Thus, a substantial portion of the delay line may not be necessary under normal operation of the IC.

Therefore, what is needed in the art is a DLL that selectively deactivates the portion of the delay line that is not necessary.

Furthermore, what is needed in the art is a DLL that reduces power consumption by clocking only those sections of the delay line that are necessary to time-align the clock signals.

Moreover, what is needed in the art is a DLL that reduces the load on the system or reference clock signal by deactivating unused sections of the delay line.

SUMMARY OF THE INVENTION

The present invention provides a delay lock loop circuit that selectively deactivates blocks of delay units that are not necessary for aligning a reference clock signal with an internal feedback clock signal.

The invention comprises, in one form thereof, a forward delay circuit that receives the reference clock signal. The forward delay circuit includes a forward delay line having a plurality of electrically interconnected delay blocks. Each of the delay blocks includes a predetermined number of electrically interconnected delay units. Disabling means disable the one or more delay blocks when the delay blocks are not needed in order to time align the reference clock signal with the internal feedback clock signal.

An advantage of the present invention is that the portion of the delay line that is not necessary is deactivated.

Another advantage of the present invention is that power consumption is reduced by clocking only those sections of the delay line that are necessary.

Yet another advantage of the present invention is that the load on the reference clock signal is reduced by deactivating unused sections of the delay line.

BRIEF DESCRIPTION OF THE DRAWINGS

The above-mentioned and other features and advantages of this invention, and the manner of attaining them, will become appreciated and be more readily understood by reference to the following detailed description of one embodiment of the invention in conjunction with the accompanying drawings, wherein.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE DRAWINGS

Figure 1:
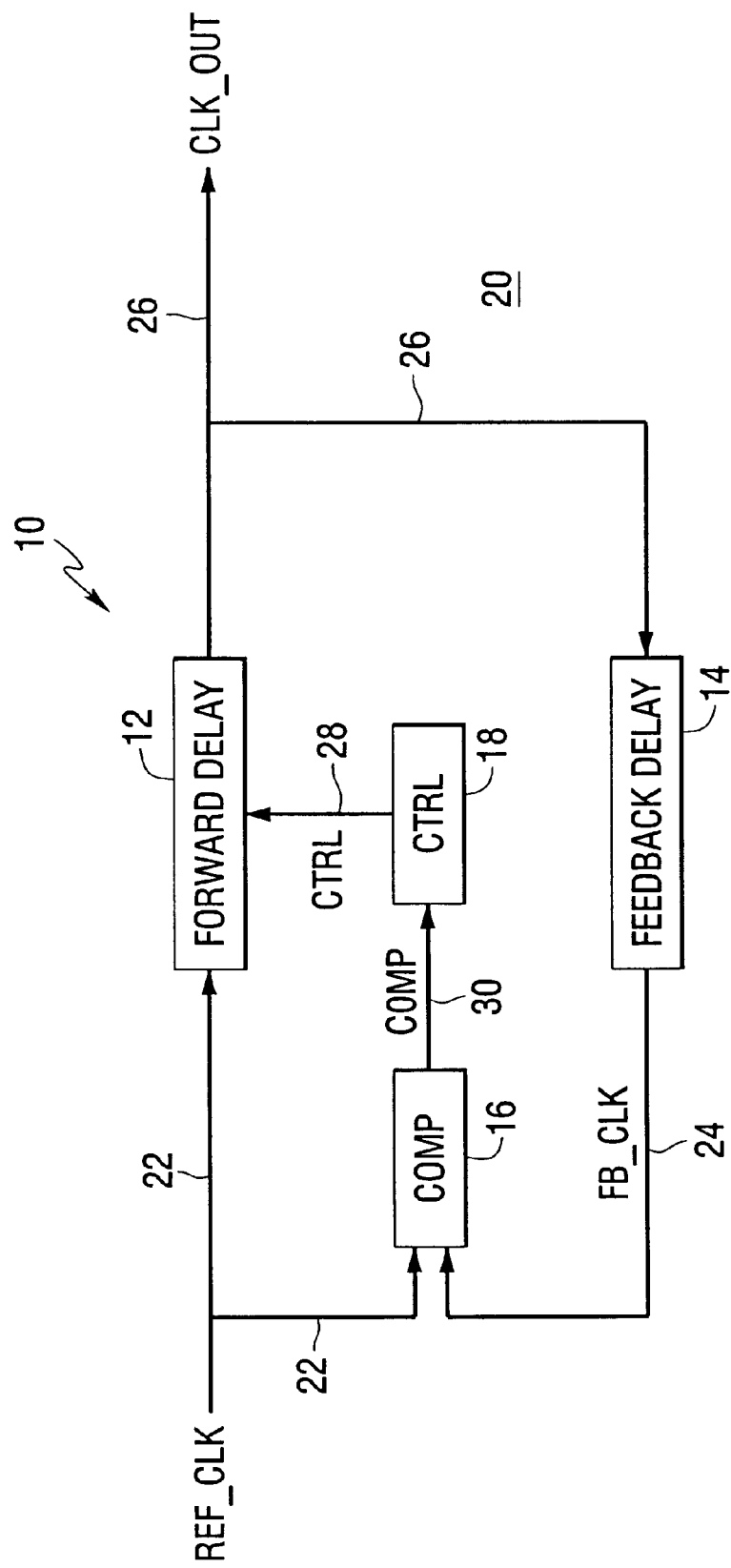
FIG. 1 is a block diagram of a conventional DLL.

Referring now to FIG. 1, a block diagram of a conventional DLL circuit is shown. DLL circuit 10 includes forward delay circuit 12, feedback delay circuit 14, compare circuit COMP 16 and control circuit CTRL 18. Typically, DLL circuit 10 is formed on a common substrate with, or is commonly packaged with and interconnected to, integrated circuit (IC) 20, such as, for example, a dynamic random access memory (DRAM) chip or any IC that requires clock skew adjustment. Generally, DLL circuit 10 receives reference clock signal REF_CLK 22, compares REF_CLK signal 22 to a feedback clock signal FB_CLK 24, and issues output clock signal CLK_OUT 26 based at least in part upon the comparison. CLK_OUT signal 26 is generated by delaying REF_CLK signal 22. The comparison and delay are iterated until FB_CLK signal 24 is aligned in time with the REF_CLK signal 22.

Forward delay circuit 12 is electrically connected to CTRL circuit 18 and receives therefrom CTRL signal 28. Forward delay circuit 12 receives REF_CLK signal 22 and issues CLK_OUT signal 26, which is generally a delayed version of REF_CLK signal 22. The amount of time by which forward delay circuit 12 delays CLK_OUT signal 26 relative to REF_CLK signal 22 is dependent at least in part upon CTRL signal 28. Forward delay circuit 12 includes a plurality of delay elements (not shown), such as, for example, buffers or invertors, connected in series. Each of the delay elements has a delay time of one unit delay, or $t_U$. A unit delay can be any period of time appropriate to the application of DLL 10, such as, for example, tens, hundreds or thousands of picoseconds, or longer.

Feedback delay circuit 14 is electrically connected to forward delay circuit 12 and receives therefrom CLK_OUT signal 26. Feedback delay circuit 14 is further electrically connected to compare circuit COMP signal 16, and issues thereto FB_CLK signal 24, which is generally a delayed version of CLK_OUT signal 26. The FB_CLK signal 24 is delayed relative to CLK_OUT signal 26 by a feedback delay time, $t_{FB}$. The feedback delay time $t_{FB}$ is, for example, substantially equal to the propagation delay $t_P$ of the REF_CLK signal 22 through IC 20 under predefined operating conditions, such as, for example, 25 degrees Celsius ambient temperature and rated operating/supply voltages applied. Feedback delay circuit 14 includes one or more delay elements (not shown), such as, for example, buffers or inverters, that delay FB_CLK signal 24 relative to the CLK_OUT signal 26 by feedback time $t_{FB}$. Feedback delay circuit, via feedback delay time $t_{FB}$, models the propagation delay through IC 20 across a predefined range of operating conditions and parameters.

Compare circuit COMP 16 receives REF_CLK signal 22 and FB_CLK signal 24. Compare circuit 16 compares REF_CLK signal 22 to FB_CLK signal 24, and issues COMP signal 30 to control circuit CTRL 18. Compare circuit COMP 16 is conventional in construction and design, such as, for example, a phase detector, and is known to those skilled in the art. COMP signal 30 is indicative of the phase of REF_CLK signal 22 relative to FB_CLK signal 24, and thus indicates whether REF_CLK signal 22 leads or lags FB_CLK signal 24.

Control circuit CTRL 18 is electrically connected to COMP circuit 16 and to forward delay circuit 12. CTRL circuit 18 issues CTRL signal 28 to forward delay circuit 12, and receives COMP signal 30 from COMP circuit 16. Dependent at least in part upon COMP signal 30, CTRL circuit 18 adjusts CTRL signal 28 to thereby increase, decrease or leave unchanged the amount of time by which forward delay circuit 12 delays CLK_OUT signal 26 relative to REF_CLK signal 22, i.e., CTRL signal 28 adjusts the length of the forward delay line of forward delay circuit 12. Control circuit CTRL 18 is configured, such as, for example, one or more shift registers or counters which cause stored data to move to the right or left one bit position based on the phase difference between REF_CLK signal 22 and FB_CLK signal 24, as will be appreciated by those skilled in the art.

In use, REF_CLK signal 22 is provided to DLL circuit 10 by, for example, an external clock network (not shown). Upon startup, DLL circuit 10 is reset such that forward delay circuit 12 introduces substantially no delay. REF_CLK signal 22 is thus passed substantially undelayed through forward delay circuit 12. CLK_OUT signal 26, i.e., the undelayed version of REF_CLK signal 22 emerging from forward delay circuit 12, is provided to feedback delay circuit 14 which issues FB_CLK signal 24. FB_CLK signal 24 is delayed relative to REF_CLK signal 22 by $t_{FB}$. FB_CLK signal 24 is compared to REF_CLK signal 22 by compare circuit COMP 16. COMP circuit 16 determines the phase relationship of the signals and issues COMP signal 30, which is indicative of that phase relationship, to control circuit CTRL 18. Control circuit CTRL 18, in turn, issues CTRL signal 28 to adjust, if necessary, the length of the forward delay line of forward delay circuit 12.

Assuming the REF_CLK 22 and FB_CLK 24 signals are exactly in phase, CTRL signal 28 sets forward delay circuit 12 to hold the current delay state of CLK_OUT signal 26 relative to REF_CLK signal 22. Thus, since the propagation delay $t_P$ is modeled by the feedback delay $t_{FB}$, CLK_OUT signal 26 is initially time-aligned with the propagation delay of IC 20. As the operating conditions of IC 20 change, and the propagation delay $t_P$ thereof increases or decreases, $t_{FB}$ changes accordingly. The above-described comparison of REF_CLK signal 22 with FB_CLK signal 24 and the adjustment in the delay of CLK_OUT signal 26 relative to REF_CLK signal 22 are repeated, with any change in $t_P$ being tracked by a corresponding change in $t_{FB}$. The change in $t_{FB}$ correspondingly alters the delay of FB_CLK signal 24. Thus, the length of time by which forward delay circuit 12 delays CLK_OUT 26 relative to REF_CLK signal 22 tracks change in $t_P$.

In order to have the capability to align the clocks in all cases, the delay line of forward delay circuit 12 must be able to increase the delay of CLK_OUT signal 26 up to the length of the cycle time of the lowest operational frequency of REF_CLK signal 22 and/or IC 20. Introducing such a relatively lengthy delay into CLK_OUT signal 26 requires forward delay circuit 12 to include a multitude of power-consuming delay elements, and thereby increases the amount of time required for DLL 10 to "lock", i.e., align in time, the clock signals, increases the power consumed by DLL 10 and increases the load DLL 10 places on the REF_CLK signal 22. In. contrast, the DLL of the present invention selectively deactivates portions of the delay line which are not being used, thereby reducing power consumption and the load on the reference clock signal.

Figure 2:
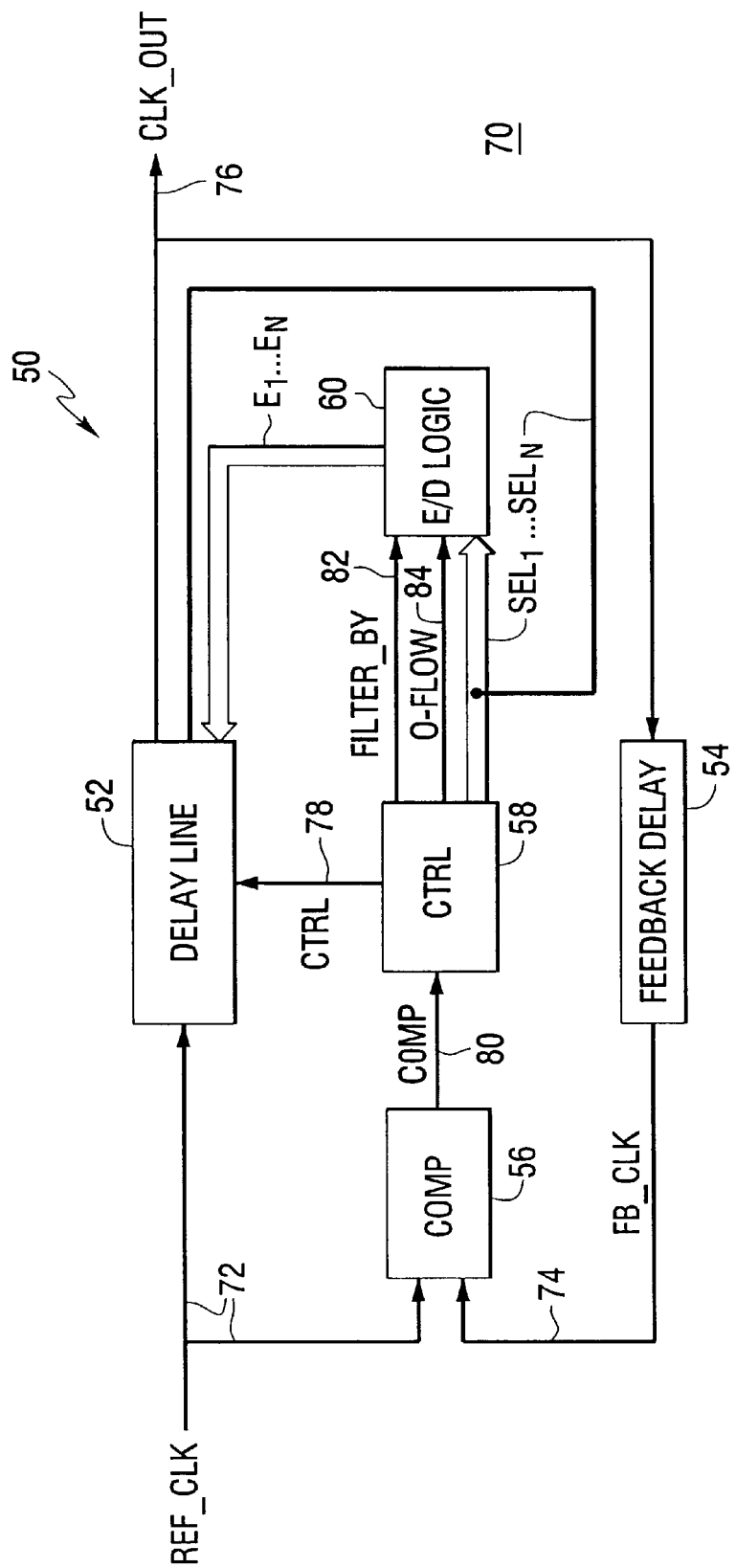
FIG. 2 is a block diagram of one embodiment of the DLL of the present invention.

Referring now to FIG. 2, a block diagram of one embodiment of a DLL of the present invention is shown. DLL 50 includes forward delay circuit 52, feedback delay circuit 54, comparator circuit COMPCKT 56, control circuit CTRL 58, and enable/disable logic 60. DLL circuit 50 is formed, for example, on a common substrate with, or is commonly packaged with and interconnected to, integrated circuit (IC) 70, such as, for example, a dynamic random access memory (DRAM) chip or any IC that requires clock skew adjustment. Generally, DLL circuit 50 receives reference clock signal REF_CLK 72, compares REF_CLK signal 72 to feedback clock signal FB_CLK 74, and adjusts the forward delay circuit 52 to thereby time align FB_CLK signal 74 with REF_CLK signal 72. Further, and still generally, DLL 50 selectively deactivates portions, or blocks, of forward delay circuit 52 that are not needed to align the signals, and thereby reduces power consumption and loading on REF_CLK signal 72.

Forward delay circuit 52 receives REF_CLK signal 72, and is interconnected with control circuit CTRL 58 and Enable/Disable logic 60. Forward delay circuit 52 receives CTRL signal 78 from CTRL circuit 58. The amount of time by which forward delay circuit 52 delays CLK_OUT signal 76 relative to REF_CLK signal 72 is dependent at least in part upon CTRL signal 78. As will be more particularly described hereinafter, forward delay circuit 52 includes a plurality of individual delay elements. A predetermined number of delay elements are grouped into respective delay blocks. Forward delay circuit 52 receives enable signals $E_1$, $E_2$, $E_3$, ... and $E_N$ from enable/disable logic 60 to selectively deactivate one or more of the delay blocks that are not in use.

Feedback delay circuit 54 is electrically connected to and receives CLK_OUT signal 76 from forward delay circuit 52. Feedback delay circuit 54 is further electrically connected to compare circuit COMPCKT 56. Feedback delay circuit issues FB_CLK signal 74 to compare circuit COMPCKT 56. FB_CLK signal 74 is essentially a delayed version of CLK_OUT signal 76. FB_CLK signal 74 is delayed relative to CLK_OUT signal 76 by a fixed feedback delay time, $t_{FB}$. The fixed delay time $t_{FB}$ is substantially equal to the propagation delay $t_P$ of REF_CLK signal 72 through IC 70 under predefined operating conditions, such as, for example, 25 degrees Celsius ambient temperature and rated operating/supply voltage applied. Feedback delay circuit 54 models the propagation delay through IC 70. Thus, as operating conditions and parameters thereof change, delay time $t_{FB}$ tracks any change in $t_P$. Feedback delay circuit 54 includes one or more delay elements (not shown) that delay FB_CLK signal 74 relative to CLK_OUT signal 76 by feedback time $t_{FB}$.

Compare circuit COMPCKT 56 receives REF_CLK signal 72 and FB_CLK signal 74. COMPCKT 56 compares REF_CLK signal 72 to FB_CLK signal 74, and issues COMP signal 80 to control circuit CTRL 58. Compare circuit COMPCKT 56 is conventional in construction and design, such as, for example, a phase detector, and is known to those skilled in the art.

Control circuit CTRL 58 is electrically connected to COMPCKT 56 and to forward delay circuit 52. CTRL circuit 58 receives COMP signal 80 from COMPCKT 56, and issues CTRL signal 78 to forward delay circuit 52. Dependent at least in part upon COMP signal 82, CTRL circuit 58 adjusts CTRL signal 78 to thereby increase, decrease or leave unchanged the amount of time by which forward delay circuit 54 delays CLK_OUT signal 76 relative to REF_CLK signal 72. Control circuit CTRL 58 includes, as is known in the art, one or more circuits (not shown), such as, for example, counters or shift registers, that cause data to move to the right or left one bit position based on the phase difference between REF_CLK signal 72 and FB_CLK signal 74 as indicated by COMP signal 82. Thus, control circuit CTRL 58 increases or decreases the length of the delay line of forward delay circuit 52 via CTRL signal 78. Control circuit CTRL 58 also issues filter bypass signal FILTER_BY 82, block select signals $SEL_1$, $SEL_2$, $SEL_3$, ... and $SEL_N$, and overflow signal O_FLOW 84 to enable/disable logic circuit 60.

Figure 3:
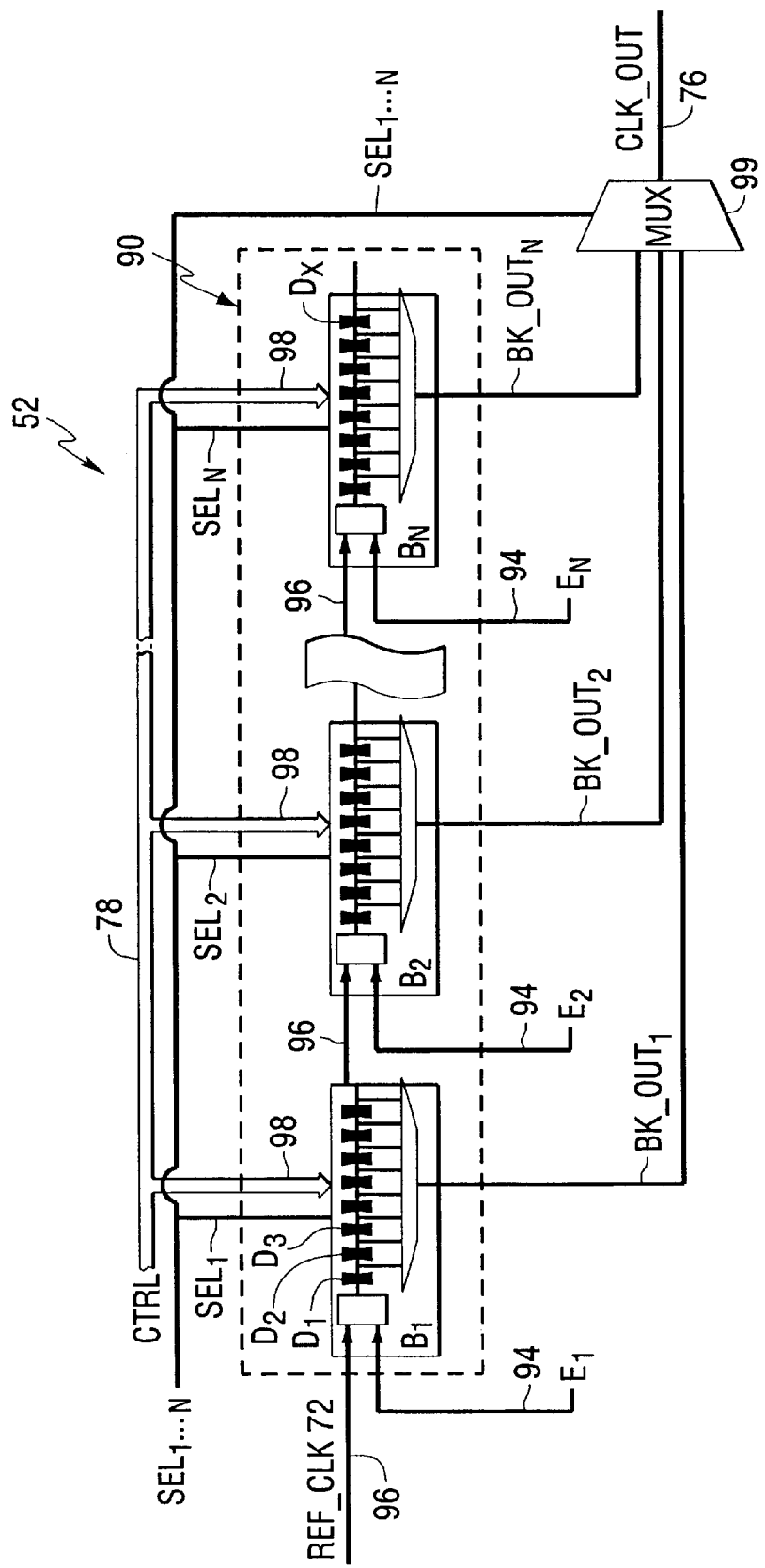
FIG. 3 is a block diagram of the delay line of the DLL of FIG. 2.

With reference to FIG. 3, forward delay circuit 52 is described with more particularity. Forward delay circuit 52 includes delay line 90. Delay line 90 includes a plurality of delay elements $D_1$, $D_2$, $D_3$ ... and $D_x$, such as, for example, buffers or invertors electrically connected in series. Each of the delay elements has a delay time of one unit delay $t_U$. A unit delay is any period of time appropriate to the application of DLL 50, such as, for example, tens, hundreds or thousands of picoseconds, or longer. The delay units are organized or grouped into delay blocks $B_1$, $B_2$, ..., and $B_N$.

Each of delay blocks $B_1$, $B_2$, ... and $B_N$ include a predetermined number, such as, for example, eight, of individual delay elements $D_1$, $D_2$, $D_3$, ..., and $D_x$. Thus, delay blocks $B_1$, $B_2$, ... and $B_N$ have a block delay time $t_B$ that is the sum of the individual unit delays $t_U$ of the individual delay elements within the particular block. Each of delay blocks $B_1$, $B_2$, ... and $B_N$ include a respective enable input 94 and receive thereon enable signals $E_1$, $E_2$, ... and $E_N$, respectively, from enable/disable logic 60. Further, each delay block $B_1$, $B_2$, ... and $B_N$ are electrically interconnected at their respective clock inputs 96, the first delay block $B_1$, receiving REF_CLK signal 72 on its clock input 96. The delay blocks $B_1$, $B_2$, ... and $B_N$ also include control inputs 98, and receive control signal CTRL 78 thereon. Each delay block $B_1$, $B_2$, ..., and $B_N$ also include a respective delay block output BK_OUT$_1$, BK_OUT$_2$, ..., and BK_OUT$_N$. A multiplexer 99 (FIG. 3), in conjunction with a signal from control circuit CTRL 58 selects, dependent at least in part upon select signals $SEL_1$, $SEL_2$, ... and $SEL_N$, which of the block outputs BK_OUT$_1$, BK_OUT$_2$, ..., and BK_OUT$_N$ delivers CLK_OUT signal 76.

Figure 4:
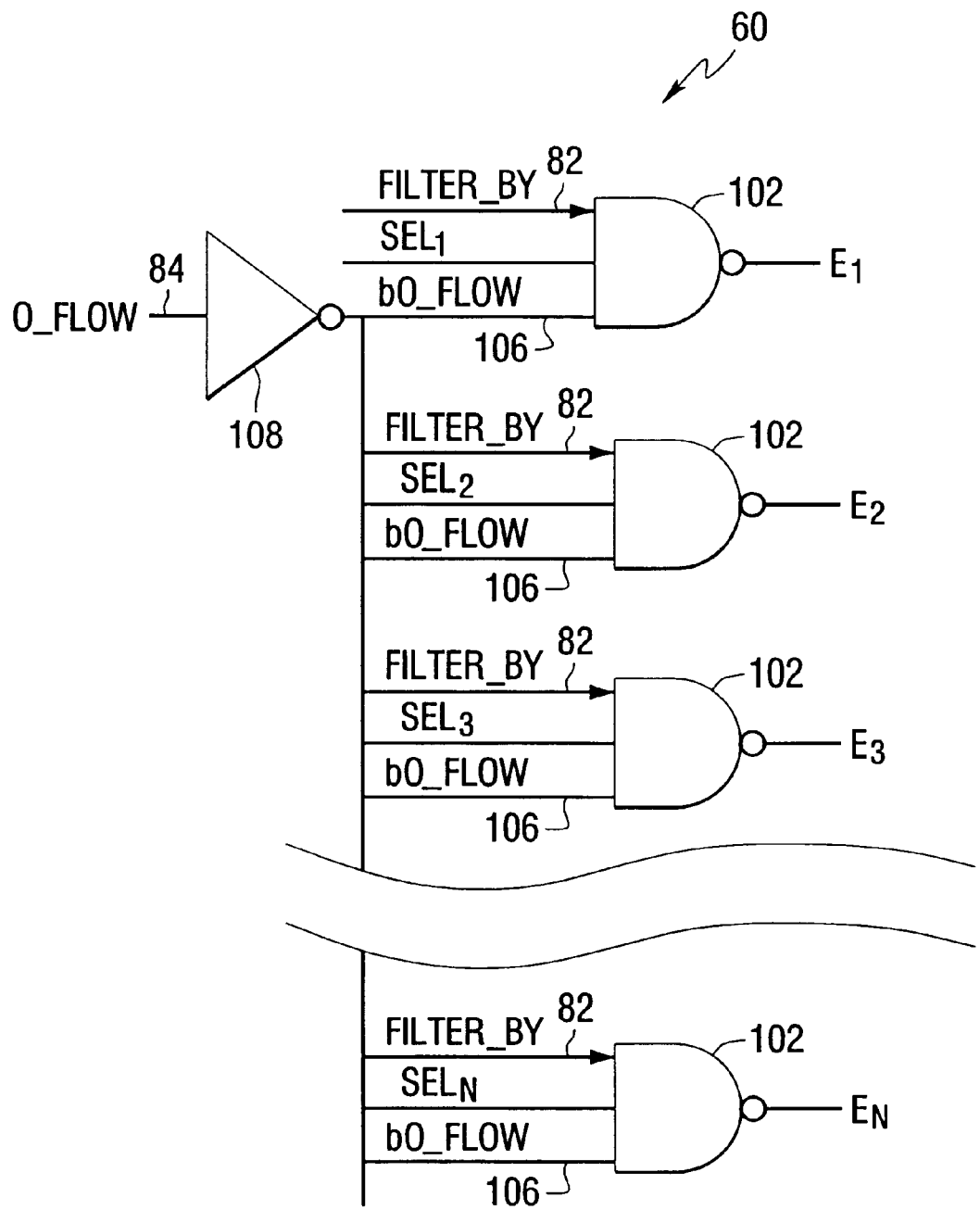
FIG. 4 is a schematic diagram of the enable/disable logic of the DLL of FIG. 2.

Enable/disable logic circuit 60, as best shown in FIG. 4, includes a plurality of enable circuits 102, such as, for example, NAND gates, each of which correspond to one of delay blocks $B_1$, $B_2$, ... and $B_N$. Each of enable circuits 102 receive filter bypass signal FILTER_BY 82, a respective and corresponding one of block select signals $SEL_1$, $SEL_2$, $SEL_3$, ... and $SEL_N$, and bO_FLOW signal 106, which inverter 108 issues as an inverted version of overflow signal O_FLOW 84 being received from control circuit CTRL 58. Enable/disable logic circuit 60 issues a plurality of enable signals $EN_1$, $EN_2$, $EN_3$, ..., and $E_N$, each of which correspond to and are received by a respective one of delay blocks $B_1$, $B_2$, ... and $B_N$. As will be explained with more particularity hereinafter, each of the FILTER_BY signal 82, bO_FLOW signal 106 and the block select signal $SEL_1$, $SEL_2$, $SEL_3$, ... and $SEL_N$ for a particular block must all be at an appropriate logic level in order for enable/disable control circuit 60 to issue an enable signal $E_1$, $E_2$, $E_3$, ... and $E_N$ that is of an appropriate logic level to disable that delay block.

In use, DLL 50 generally operates to selectively deactivate, through enable/disable logic circuit 60, one or more of delay blocks $B_1$, $B_2$, $B_3$, ..., and $B_N$ that are not needed. By deactivating delay blocks that are not needed, DLL 50 reduces power consumption and the load on the REF_CLK signal 72. The only time one or more of delay blocks $B_1$, $B_2$, $B_3$, ... and $B_N$ are disabled is when no overflow condition exists, a "coarse lock" between FB_CLK signal 74 and REF_CLK signal 72 has been achieved, and the particular block output is not selected.

An overflow condition occurs when a control counter (not shown) within CTRL circuit 58 reaches a maximum value and sets an overflow bit, thereby indicating the entire delay line 90 is required in order to align the clock signals. In the event of an overflow condition, O_FLOW signal 84 is active, such as, for example, a logic high. As the inverse of O_FLOW signal 84, bO_FLOW signal 106 becomes active, such as, for example, a logic high, only when an overflow condition does not exist (i.e., when O_FLOW signal 84 is not active, such as, for example, at a logic low level).

A "coarse lock" condition is known to those skilled in the art to indicate a condition in which no increment or decrement in the length of delay line 90 is necessary, and any fine adjustments between the clock signals is achieved by an analog mixer or equivalent circuitry (not shown) within CTRL circuit 58. The existence of a coarse lock condition is indicated by CTRL circuit 58 making FILTER_BY signal 82 active. FILTER_BY signal 82 is active, such as, for example, a logic high level, during the time that the filter is bypassed, i.e., until a coarse lock condition is achieved.

One or more of delay blocks $B_1$, $B_2$, $B_3$, ..., and $B_N$ are selected by CTRL circuit 58 making the select signals $SEL_1$, $SEL_2$, $SEL_3$, ..., and $SEL_N$ that correspond to the selected delay block(s) active, such as, for example, a logic low level. As stated above, multiplexer 99 (FIG. 3) selects, dependent at least in part upon select signals $SEL_1$, $SEL_2$, ... and $SEL_N$, which of the block outputs $BK\_OUT_1$, $BK\_OUT_2$, ... and $BK\_OUT_N$ delivers CLK_OUT signal 76.

In short, FILTER_BY signal 82 and bO_FLOW signal 106 are both active only when the filter is bypassed and an overflow condition does not exist. Select signals $SEL_1$, $SEL_2$, $SEL_3$, ... and $SEL_N$ are active only when the delay block corresponding thereto is selected. For purposes of illustration, FILTER_BY signal 82 and bO_FLOW signal 106 are hereinafter considered active when at a high logic level and select signals $SEL_1$, $SEL_2$, $SEL_3$, ... and $SEL_N$ are hereinafter considered active when at a low logic level.

Each of FILTER_BY signal 82, bO_FLOW signal 106 and select signals $SEL_1$, $SEL_2$, $SEL_3$, ... and $SEL_N$ are received by enable/disable logic circuit 60. Enable/disable logic circuit, dependent at least in part upon those signals, issues enable signals $E_1$, $E_2$, $E_3$, ... and $E_N$. More particularly, FILTER_BY signal 82 and bO_FLOW signal 106 are received by each of enable circuits 102, whereas each select signal $SEL_1$, $SEL_2$, $SEL_3$, ... and $SEL_N$ is received by a corresponding one of enable circuits 102. As stated above, the only time one or more of delay blocks $B_1$, $B_2$, $B_3$, ... and $B_N$ are disabled is when the filter is being bypassed (i.e., a coarse lock condition is achieved), there is no overflow condition, and the corresponding output for a particular block is not selected. Thus, a delay block $B_1$, $B_2$, $B_3$, ... and $B_N$ is disabled only when FILTER_BY signal 82 and bO_FLOW signal 106 are active, and a corresponding select signal $SEL_1$, $SEL_2$, $SEL_3$, ... and $SEL_N$ for that particular block is not active. When such a condition exists for a given delay block $B_1$, $B_2 B_3$, ... and $B_N$, that particular delay block is not needed in order to align the clock signals. Accordingly, enable/disable logic circuit 60 issues to that given delay block an enable signal $E_1$, $E_2$, $E_3$, ... and $E_N$ that is of an appropriate logic level, such as, for example, a logic low level, to deactivate the delay block. By deactivating delay blocks that are not needed in order to align the clock signals DLL 50 reduces power consumption and the load on the REF_CLK signal 72.

In the embodiment shown, enable circuits 102 are configured as NAND gates. However, it is to be understood that the enable circuits can be alternately configured, such as, for example, AND gates a corresponding alternately-configured delay blocks that are enabled by an enable signal of a high logic level. One skilled in the art will appreciate that this and various other configurations are possible depending upon the logic level at which the signals input to the enable circuits are active and/or inactive.

In the embodiment shown, CTRL circuit 58 issues CTRL signal 78 and select signals $SEL_1$, $SEL_2$, $SEL_3$, ... and $SEL_N$. However, it is to be understood that the DLL of the present invention can be alternately configured, such as, for example, including the select signals in the control signal.

In the embodiment shown, the filter bypass signal and overflow signals are illustratively described as being at a logic high level when the filter is bypassed and an overflow condition does not exist, whereas the select signals are described as being at a logic low level only when a corresponding delay block is selected. However, it is to be understood that the DLL of the present invention can be alternately configured for functionality with the active logic states of the various signals.

While this invention has been described as having a preferred design, the present invention can be further modified within the spirit and scope of this disclosure. This application is therefore intended to cover any variations, uses, or adaptations of the present invention using the general principles disclosed herein. Further, this application is intended to cover such departures from the present disclosure as come within the known or customary practice in the art to which this invention pertains and which fall within the limits of the appended claims.

What is claimed:

1. A delay lock loop circuit receiving a reference clock signal, said delay lock loop (DLL) circuit for aligning in time the reference clock signal and an internal feedback clock signal, said DLL circuit comprising:

a forward delay circuit receiving said reference clock signal, said forward delay circuit including a forward delay line having a plurality of electrically interconnected delay blocks, each of said delay blocks including predetermined number of electrically interconnected delay units; and disabling means deactivating at least one of said delay blocks when said at least one delay block is not needed in order to align in time said reference clock signal and said internal feedback clock signal, wherein said disabling means issues a respective enable signal to each of said delay blocks, each of said delay blocks being effectively connected to and disconnected from the reference clock signal dependent at least in part upon said enable signals; and wherein each of said delay blocks include a respective block output, each of said delay blocks receiving a respective block select signal, said block outputs being selected dependent at least in part upon a corresponding one of said block select signals, said block select signals being received by said disabling means, said disabling means generating each respective enable signal dependent at least in part upon a corresponding one of said block select signals.

2. The delay lock loop circuit receiving a reference clock signal, said delay lock loop (DLL) circuit for aligning in time the reference clock signal and an internal feedback clock signal, said DLL circuit comprising:

a forward delay circuit receiving said reference clock signal, said forward delay circuit including a forward delay line having a plurality of electrically interconnected delay blocks, each of said delay blocks including predetermined number of electrically interconnected delay units; and disabling means deactivating at least one of said delay blocks when said at least one delay block is not needed in order to align in time said reference clock signal and said internal feedback clock signal, wherein said disabling means issues a respective enable signal to each of said delay blocks, each of said delay blocks being effectively connected to and disconnected from the reference clock signal dependent at least in part upon said enable signals, and wherein said disabling means comprises a plurality of enable circuit, each of said enable circuit corresponding to one of said delay blocks and receiving a corresponding one of said block select signal said plurality of enable circuit issuing to a corresponding one of said delay blocks a respective one of said enable signal.

3. The delay lock loop circuit of claim 2, further comprising:

a control circuit issuing a filter bypass signal and an overflow signal, said filter bypass signal indicating whether said delay lock loop circuit has achieved a coarse lock condition between said reference clock signal and said internal feedback clock signal, said overflow signal indicating whether an entire length of said forward delay line is needed to align in time said reference clock signal with said internal feedback clock signal.

4. The delay lock loop circuit of claim 3, wherein each of said enable circuits receive said filter bypass signal and said overflow signal, said enable signals being dependent at least in part upon said filter bypass signal and said overflow signal.

5. The delay lock loop circuit of claim 3, wherein each of said disabling means further comprises an inverter, said inverter receiving said overflow signal and issuing an inverted overflow signal, and enable circuit receiving said inverted overflow signal, said filter bypass signal and said block select signal.

6. The delay lock loop circuit of claim 5, wherein said enable circuits comprise a plurality of NAND gates.

7. An enable/disable circuit for use with a delay lock loop circuit, the delay lock loop circuit having a forward delay line, the forward delay line including a plurality of forward delay blocks, each of said forward delay blocks having a predetermined number of forward delay elements, the delay lock loop circuit issuing a filter bypass signal, a respective block select signal to each of said forward delay blocks, and an overflow signal, said enable/disable circuit comprising:

a logic circuit receiving said filter bypass signal, said block select signals and said overflow signal, said logic circuit issuing a respective enable signal to each of the plurality of forward delay blocks, each of said enable signals being dependent at least in part upon said filter bypass signal, a corresponding one of said block select signals, and said overflow signal.

8. The enable/disable circuit of claim 7, wherein said logic circuit comprises:

a plurality of enable circuit each receiving said filter bypass signal, said overflow signal, and a corresponding one of said block select signals, each of said plurality of enable circuit issuing a respective enable signal to a corresponding one of the plurality of forward delay blocks, said enable signals being dependent at least in part upon said filter bypass signal, said overflow signal and said corresponding one of said block select signals.

9. The enable/disable circuit of claim 7, wherein said logic circuit comprises an inverter receiving said overflow signal and issuing an inverted overflow signal; and a plurality of enable circuit each receiving said filter bypass signal, said inverted overflow signal, and a corresponding one of said block select signals, each of said plurality of enable circuit issuing a respective enable signal to a corresponding one of the plurality of forward delay blocks, said enable signals being dependent at least in part upon said filter bypass signal, said overflow signal and said corresponding one of said block select signals.

10. The enable/disable circuit of claim 9, wherein said enable circuits comprise NAND gates.

11. A dynamic random access memory integrated circuit, comprising:

A delay lock loop circuit receiving a reference clock signal, said delay lock loop (DLL) circuit aligning in time said reference clock signal with an internal feedback clock signal, said DLL circuit comprising:

a forward delay circuit receiving said reference clock signal, said forward delay circuit including a forward delay line having a plurality of electrically interconnected delay blocks, each of said delay blocks including predetermined number of electrically interconnected delay units; and disabling means for electrically disconnecting at least one of said delay blocks from said reference clock signal when said at least one delay block is not needed in order to align said output clock signal with said internal feedback clock signal, wherein said disabling means issues a respective enable signal to each of said delay blocks, each of said delay blocks being electrically connected to and disconnected from the reference clock signal dependent at least in part upon said enable signals, and wherein each of said delay blocks include a respective block output, each of said delay blocks receiving a respective block select signal, said block outputs being selected dependent at least in part upon a corresponding one of said block select signals, said block select signals being received by said disabling means, said disabling means generating each respective enable signal dependent at least in part upon a corresponding one of said block select signals.

12. A dynamic random access memory integrated circuit, comprising:

A delay lock loop circuit receiving a reference clock signal, said delay lock loop (DLL) circuit aligning in time said reference clock signal with an internal feedback clock signal, said DLL circuit comprising:

a forward delay circuit receiving said reference clock signal, said forward delay circuit including a forward delay line having a plurality of electrically interconnected delay blocks, each of said delay blocks including predetermined number of electrically interconnected delay units; and disabling means for electrically disconnecting at least one of said delay blocks from said reference clock signal when said at least one delay block is not needed in order to align said output clock signal with said internal feedback clock signal, wherein said disabling means comprises a plurality of enable circuits, each of said enable circuits corresponding to one of said delay blocks and receiving a block select signal, said plurality of enable circuits issuing to a corresponding one of said delay blocks a respective one of said enable signals and wherein said disabling means issuing a respective enable signal to each of said delay blocks, each of said delay block being electrically connected to and disconnected from the reference clock signal dependent at least in part upon said enable signals.

13. The dynamic random access memory integrated circuit of claim 12, wherein said delay lock loop circuit further comprises:

a control circuit issuing a filter bypass signal and an overflow signal, said filter bypass signal indicating whether said delay lock loop circuit has achieved a coarse lock condition between said reference clock signal and said internal feedback clock signal, said overflow signal indicating whether an entire length of said forward delay line is needed to align said output clock signal with said internal feedback clock signal.

14. The delay lock loop circuit of claim 13, wherein each of said enable circuits receive said filter bypass signal and said overflow signal, said enable signals being dependent at least in part upon said filter bypass signal and said overflow signal.

15. The delay lock loop circuit of claim 13, wherein said disabling means further comprises an inverter, said inverter receiving said overflow signal and issuing an inverted overflow signal, said enable circuit receiving said inverted overflow signal, said filter bypass signal and said block select signal.

16. The delay lock loop circuit of claim 15, wherein said enable circuits comprise a plurality of NAND gates.

17. A method of disabling one or more delay block of a forward delay line in a delay lock loop circuit, a reference clock signal being routed through the forward delay line, said method comprising:

receiving an overflow signal from said delay lock loop circuit, said overflow signal being active when an entire length of said delay line is needed;

receiving a filter bypass signal, said filter bypass signal being active when said delay lock loop circuit has achieved a coarse lock condition;

receiving a plurality of block select signals, said block select signals being active when a corresponding delay block is selected; and issuing a respective enable signal to each of said delay blocks, said enable signal disabling a corresponding delay block when said overflow signal is inactive, said filter bypass signal is active, and said block select signal is inactive.

18. A delay lock loop circuit receiving a reference clock signal, said delay lock loop (DLL) circuit for aligning in time the reference clock signal and an internal feedback clock signal, said DLL circuit comprising:

a control circuit issuing a control signal;

a forward delay circuit receiving said reference clock signal, said forward delay circuit including a forward delay line, said forward delay line having a plurality of electrically interconnected delay blocks, each of said delay blocks including a predetermined number of electrically interconnected delay units; each of said delay blocks receiving said control signal, said forward delay circuit adjusting a length of said forward delay line dependent at least in part upon said control signal to hereby achieve a coarse lock condition; and disabling means deactivating at least one of said delay blocks when said at least one delay block is not needed in order to align in time said reference clock signal and said internal feedback clock signal.

* * * * *